United States Patent [19]
Tuma et al.

[11] 4,052,626
[45] Oct. 4, 1977

[54] FREQUENCY DOUBLER

[75] Inventors: Alois Vaclav Tuma, Schlieren; Jörg Schiess, Stallikon, both of Switzerland

[73] Assignee: RCA Corporation, New York, N.Y.

[21] Appl. No.: 714,123

[22] Filed: Aug. 13, 1976

[30] Foreign Application Priority Data

Dec. 8, 1975 United Kingdom ............... 50278/75

[51] Int. Cl.² .......................... H03K 1/08; H03K 1/16
[52] U.S. Cl. .................................... 307/271; 307/261; 328/20; 328/36; 330/261
[58] Field of Search ................ 328/20, 36; 330/30 D; 307/290, 261, 228, 271

[56] References Cited

U.S. PATENT DOCUMENTS

| | | | |
|---|---|---|---|
| 3,262,069 | 7/1966 | Stella | 328/20 |
| 3,310,688 | 3/1967 | Ditkofsky | 330/30 D |
| 3,502,911 | 3/1970 | Lehman | 330/30 D |
| 3,548,317 | 12/1970 | Bordonaro | 328/20 |
| 3,781,699 | 12/1973 | Sakamoto | 330/30 D |
| 3,796,960 | 3/1974 | Frizzell et al. | 328/20 |

*Primary Examiner*—John S. Heyman
*Attorney, Agent, or Firm*—E. M. Whitacre; P. J. Rasmussen; J. Laks

[57] ABSTRACT

A biasing circuit biases the second of two input terminals of a differential amplifier at a first reference level. A sawtooth voltage of a first frequency is coupled to the first input terminal. A bilevel voltage generated at an output terminal of the differential amplifier shifts levels when the sawtooth voltage equals the first reference voltage level. A second biasing circuit coupled to the first input terminal biases the first input terminal at a second reference voltage level differing from the first reference level by an offset voltage. The second reference level is selected to equalize the duration of each of the bilevel voltages. Output signals are produced when the bilevel voltage shifts levels, thereby producing the output signals at twice the first frequency.

15 Claims, 15 Drawing Figures

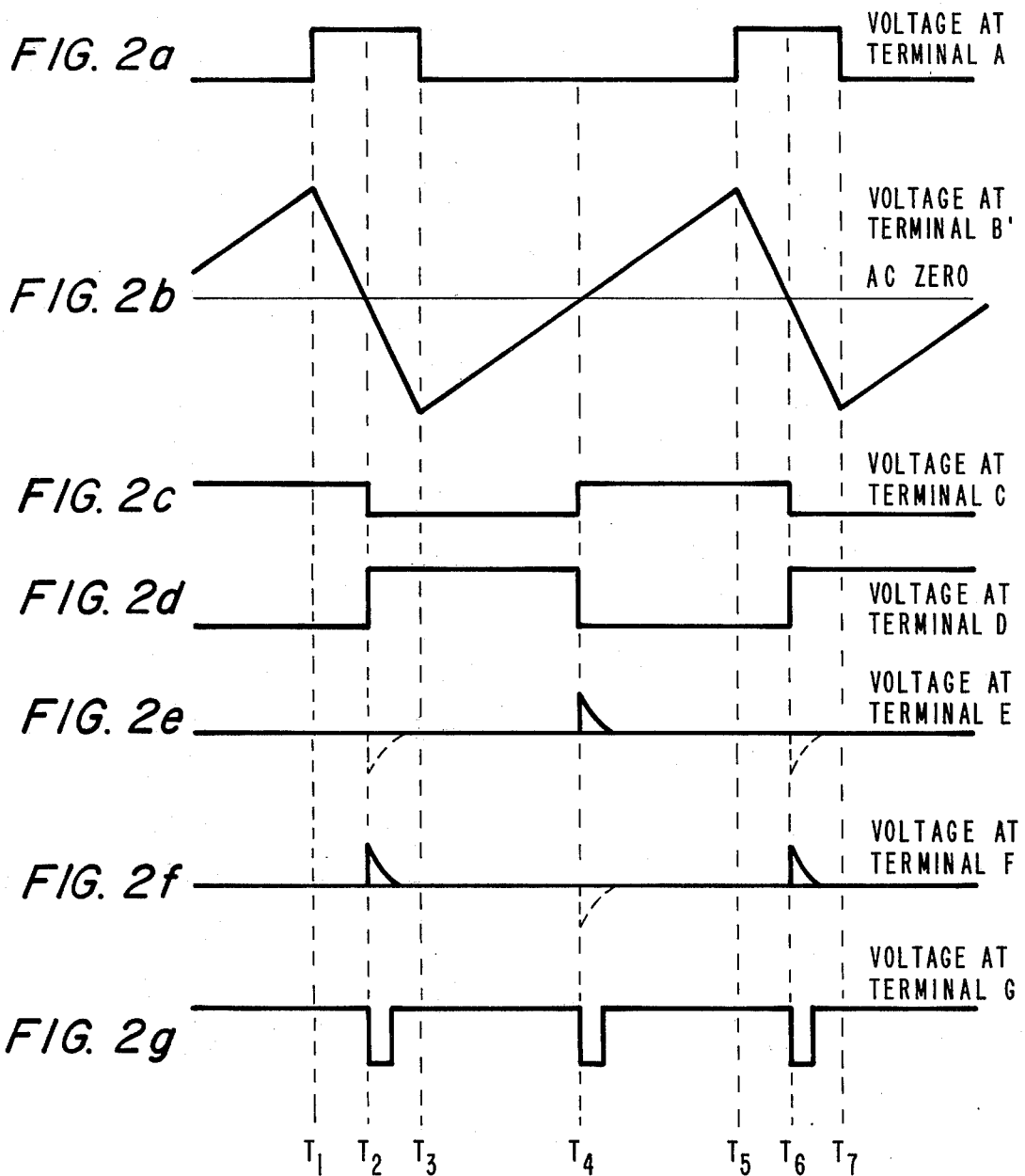

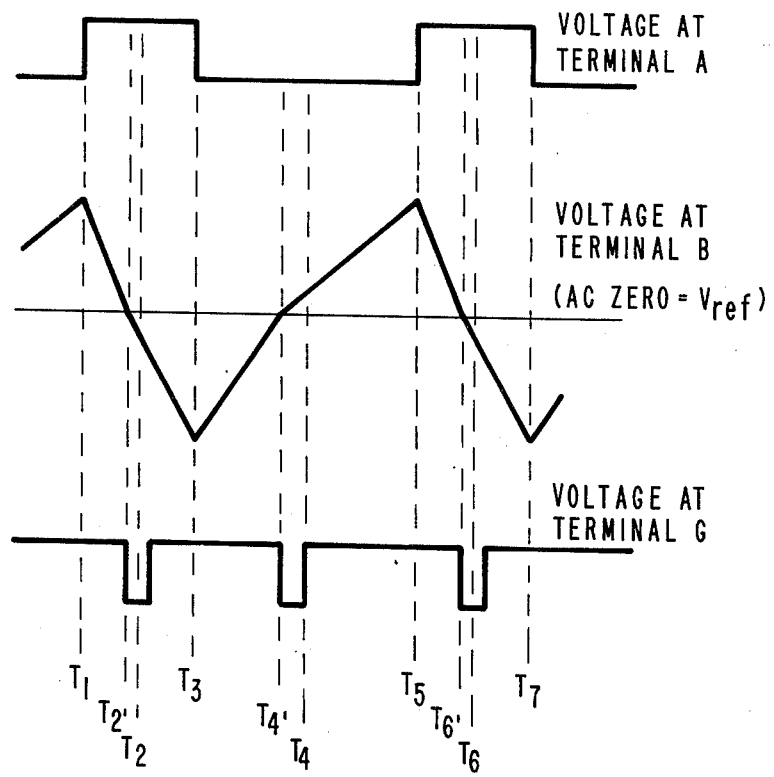
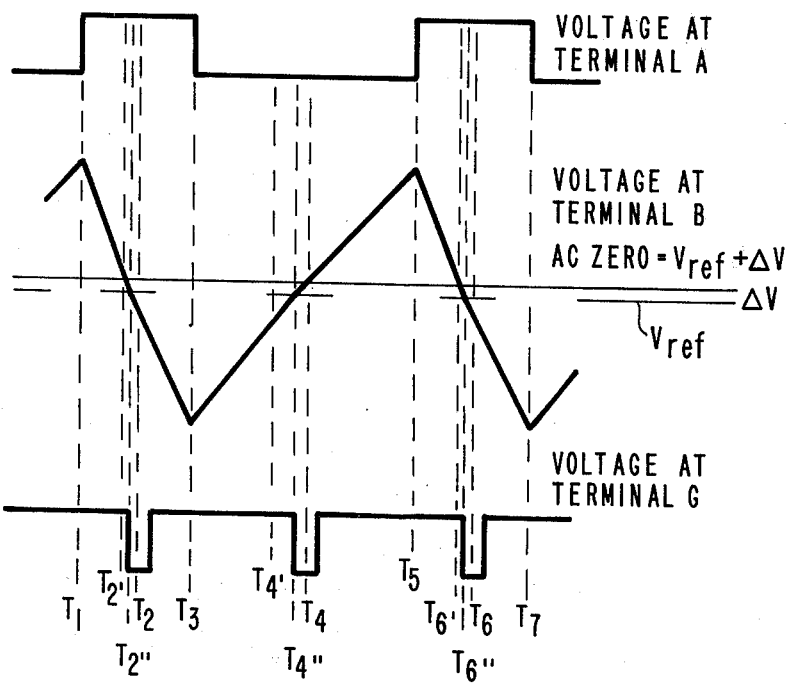

FREQUENCY DOUBLER

BACKGROUND OF THE INVENTION

This invention relates to frequency doublers.

In a television receiver, synchronization of the vertical scan to the horizontal scan is required for proper picture display. Lack of synchronization will cause picture roll and poor interlaced scanning. To provide for synchronization, many television systems make use of the horizontal flyback pulses derived from the horizontal deflection circuits. As described in U.S. Pat. No. 3,878,336 granted to A. R. Balaban, input signals occurring at the horizontal frequency rate $f_H$ obtained, for example, from the horizontal output transformer, are doubled in frequency. The frequency doubled output signals are then coupled to a vertical countdown system which drives the vertical deflection circuits. If the frequency doubler's output signals deviate from a $2f_H$ rate even slightly, poor interlacing and a blurred picture result.

Some frequency doubling circuits use a $2f_H$ vertical oscillator together with a phase detector, such as a phased-locked loop, to lock the oscillator to the $f_H$ input signals. A potentiometer is required for setting the oscillator frequency. Since many vertical countdown systems, such as described in the aforementioned patent, eliminate the vertical oscillator and its associated frequency set potentiometer, a frequency doubler which does not require any tuning elements or adjustment is desirable.

SUMMARY OF THE INVENTION

A differential amplifier has the second of two input terminals coupled to a first biasing circuit for biasing the input terminal at a first reference voltage level. A bilevel voltage is generated at an output terminal of the differential amplifier in response to a sawtooth voltage that is repeating at a first frequency and that is coupled to the first input terminal. The bilevel voltage shifts levels when the sawtooth voltage equals the first reference voltage level. A second biasing circuit coupled to the first input terminal biases the first input terminal at a second reference voltage level differing from the first reference voltage level by an offset voltage. The second reference voltage level is selected to equalize the duration of each of the bilevel voltage levels. The bilevel voltage thereby shifts levels at a rate of twice the first frequency.

BRIEF DESCRIPTION OF THE DRAWINGS

FIGS. 2A - 2G are waveforms associated with the operation of the circuits of FIGS. 1 and 5;

FIGS. 3A - 3C are other waveforms associated with the operation of the circuits of FIGS. 1 and 5;

FIGS 4A - 4C are still other waveforms associated with the operation of the circuits of FIGS. 1 and 5.

DESCRIPTION OF THE INVENTION

Figure 1:
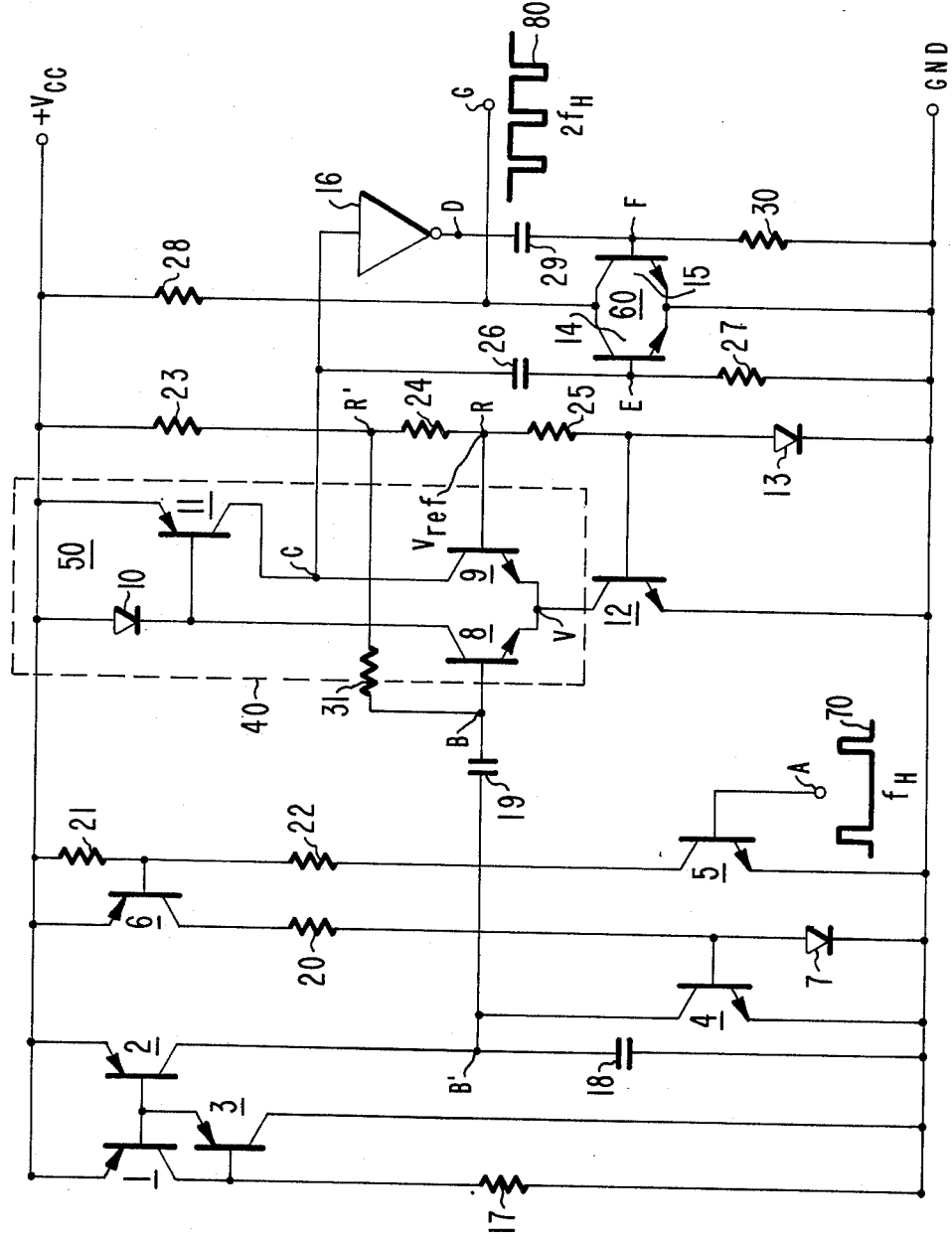
FIG. 1 is a circuit schematic of an embodiment of a frequency doubler according to the invention.

In FIG. 1, transistors 1 through 3 and a biasing resistor 17 form a conventional constant current source for linearly charging a capacitor 18. One end of charging capacitor 18 is coupled to the collector of transistor 2 at a terminal B'; the other end of charging capacitor 18 is coupled to ground.

At time $T_1$ of FIG. 2A, an input voltage pulse 70 obtained from a source, not shown, and repeating at frequency $f_H$, is received at a terminal A. The pulse is applied to the base of an input transistor 5, forward biasing it. The collector of transistor 5 is coupled to the base of a transistor 6 through a resistor 22. The base of transistor 6 is coupled to a $+V_{cc}$ supply through a resistor 21, while the emitter of transistor 6 is directly coupled to the $+V_{cc}$ supply. When transistor 5 conducts, transistor 6 is forward biased and also conducts. The collector of transistor 6 is coupled through a resistor 20 to the common terminal of the base of a transistor 4 and anode of a diode 7. The emitter of transistor 4 is coupled to the cathode of diode 7 and to ground.

When transistor 6 conducts, diode 7 is forward biased, thereby forward biasing transistor 4. The collector of transistor 4 is coupled to terminal B'. When transistor 4 conducts, capacitor 18 linearly discharges (see FIG. 2B). At time $T_3$, the input voltage pulse at A has shifted to its lower level, cutting off transistors 5 and 6, thereby cutting off diode 7 and transistor 4. Capacitor 18 begins recharging from the constant current source until the next input voltage pulse reinitiates the cycle. As may be seen by inspection of FIGS. 2A and 2B, input voltage signals at terminal A produce an output sawtooth voltage at terminal B' of the same frequency.

The sawtooth voltage at terminal B' is AC coupled through a coupling capacitor 19 to the base of a transistor 8. The base of transistor 8 forms a first input terminal B of a differential amplifier 40 comprising transistors 8 and 9 whose emitters are coupled together. A switching circuit 50 comprises a diode 10 and transistor 11. The base of transistor 9 forms a second input terminal R, which is coupled to one end of a resistor 25, at which a frist DC reference bias voltage, $V_{ref}$, is derived. $V_{ref}$ is obtained from a voltage divider comprising serially coupled resistors 23, 24, 25 and diode 13 coupled between $+V_{cc}$ and ground.

The base of transistor 8 is coupled through a resistor 31 to a terminal R', which is coupled to one end of an offset voltage developing resistor 24. The other end of resistor 24 is coupled to the base of transistor 9. The voltage at the base of transistor 8 is therefore at a second reference level displaced from $V_{ref}$ by an offset voltage, $\Delta V$, developed across resistor 24. The function of the offset voltage will be explained further.

The emitters of transistors 8 and 9 are coupled at a terminal V to a constant current source comprising a transistor 12 and diode 13. The base of transistor 12 is coupled to the anode of diode 13 and the emitter of transistor 12 is coupled to ground. The collector of transistor 8 is coupled to the cathode of diode 10 and to the base of transistor 11. The anode of diode 10 is coupled to the emitter of transistor 11 and to the $+V_{cc}$ supply. The collector of transistor 11 is coupled to the collector of transistor 9 and to an output terminal C for providing a bilevel output voltage at the output terminal.

Diode 13 conducts through series resistances 23 through 25 and provides forward bias for transistor 12. A voltage level $V_{min}$ is established at terminal V equal to the voltage at $V_{ref}$ less the $V_{be}$ drop of transistor 9. Neglecting for the moment the effect of the offset voltage, $\Delta V$, when the input voltage at terminal B becomes more positive than the reference voltage $V_{ref}$ at time $T_4$, transistor 8 becomes forward biased. Transistor 8 conducts from the +$V_{cc}$ supply through diode 10. At this time, transistor 11 is forward biased and conducts in a saturated state. $V_{CE(sat)}$ of transistor 11 is small, and the bilevel output voltage at terminal C shifts to its upper level, as shown in FIG. 2C at time $T_4$. As the input voltage at the base of transistor 8 increases, transistor 8 conducts more current, the voltage level at its emitter thereby increasing. Transistor 9 is no longer forward biased and thereby cuts off. The current entering the collector of transistor 12 nonetheless remains constant.

Output terminal C is coupled to ground through a differentiating network including the series combination of a capacitor 26 and a resistor 27, the junction of capacitor 26 and resistor 27 being at a terminal E. When the bilevel voltage at terminal C shifts to its upper level at time $T_4$, the step increase in voltage is differentiated and appears as a positive pulse, as shown in FIG. 2E.

The base of a transistor 14 is coupled to terminal E and forms one input of a signal shaping circuit 60 comprising transistors 14 and 15. The emitter of transistor 14 is coupled to ground. The collector of transistor 14 is coupled to an output terminal G and then through a current limiting resistor 28 to the +$V_{cc}$ supply. The positive differentiated pulse at terminal E is shaped by transistor 14 and appears as a rectangular pulse 80 at output terminal G.

When the sawtooth input voltage at terminal B decreases to $V_{ref}$ (again neglecting for the moment the effect of the offset $\Delta V$) at time $T_6$, transistor 8 cuts off, cutting off diode 10 and transistor 11. The voltage at terminal V thus is maintained at $V_{min}$, while transistor 8 is off. Capacitor 26 discharges to ground through transistors 9 and 12, and the output voltage level at terminal C shifts at time $T_6$ from its upper to its lower level. Diode 10 and transistor 11 thus act as a switch controlled by the input sawtooth and the differentially coupled transistors, to switch the bilevel output voltage at terminal C between its upper and lower levels. A negative differentiated pulse appears at terminal E at time $T_6$ (and at time $T_2$), but the corresponding rectangular pulse does not appear at terminal G, since transistor 14 is reversed biased for the pulse duration.

Terminal C is coupled to the input of an inverter 16, the output of which is at a terminal D. As shown in FIG. 2D, the bilevel output voltage at terminal D is 180° out-of-phase with the output voltage at terminal C. The bilevel output voltage at terminal D is differentiated by a capacitor 29 and a resistor 30, as shown in FIG. 2F. The positive differentiated pulses at a terminal F at times $T_2$ and $T_6$ are shaped by a transistor 15 and appear as rectangular pulses at the output terminal G. The rectangular pulse corresponding to the negative differentiated pulse at time $T_4$ does not appear at terminal G since transistor 15 is reversed biased for the pulse duration.

By inspecting FIGS. 2A and 2G, one may readily ascertain that input signals at terminal A of a frequency $f_H$ are transformed by the circuit of FIG. 1 into output signals at terminal G of a frequency $2f_H$. The output signals are produced when the sawtooth voltage at terminal B reaches $V_{ref}$, thereby changing the conduction state of transistor 8, thereby shifting levels of the bilevel voltage at output terminal C.

The necessity for the offset voltage $\Delta V$ will now be explained with reference to FIGS. 3A - 3C and FIGS. 4A - 4C. As mentioned previously, output signals at terminal G are produced when the input sawtooth voltage at terminal B equals $V_{ref}$. Transistor 8 conducts when the voltage at terminal B is greater than $V_{ref}$ and does not conduct when the voltage at terminal B is lower than $V_{ref}$.

The sawtooth waveform of FIG. 2B is derived, in response to the input signals of FIG. 3A, by discharging capacitor 18 during the intervals $T_1 - T_3$ and $T_5 - T_6$ and by charging capacitor 18 during the interval $T_3 - T_5$. By using a single-ended supply, such as +$V_{cc}$ insted of a bipolar supply, the reference voltage at terminal B is established at a reference voltage different than zero. The sawtooth voltage at terminal B' must therfor be AC coupled to terminal B by capacitor 19. The AC zero or the average DC value of the sawtooth voltage has thus shifted to $V_{ref}$.

During the first portion of the discharge interval when the voltage at terminal B is greater than $V_{ref}$, transistor 8 is conducting and is drawing base current away from terminal B. Capacitor 19 is thereby being discharged at a faster rate than during the second portion of the discharge interval when the voltage at terminal B is less than $V_{ref}$, when transistor 8 is cut off, and no base current is being drawn from capacitor 19. Because of the faster discharge of capacitor 19 during the first portion of the discharge interval, the voltage at terminal B reaches $V_{ref}$ at the earlier times of $T_2'$ and $T_6'$ relative to $T_2$ and $T_6$, respectively, of FIG. 3B. Output signals thus occur at terminal G, not at times $T_2$ and $T_6$, but at earlier times $T_2'$ and $T_6'$, as shown in FIG. 3C.

A similar situation arises during the charging interval, with capacitor 19 charging at a slower rate during the second portion of the charging interval when transistor 8 is on and drawing base current. The voltage at terminal B reaches $V_{ref}$, not at time $T_4$ but at time $T_4'$, and an output signal is produced, not at time $T_4$ but at time $T_4'$.

An inspection of FIG. 3C thus reveals an assymmetry in the production of the frequency doubled output signals caused by the base current that is being drawn by transistor 8. The interval $T_2' - T_4'$ does not equal the interval $T_4' - T_6'$, and the output signals 80 of FIG. 1 are not produced at exactly the doubled frequency rate.

If the input signals are derived from horizontal flyback pulses, the frequency doubled output signals may then be used to synchronize the vertical deflection system of a television receiver to the incoming vertical sync signals. If the output signals are assymmetrical and do not occur at twice the horizontal frequency, poor interlace results.

To restore symmetry to the output signals, input terminal B is biased to a second reference voltage level differing from $V_{ref}$ by an offset voltage $\Delta V$. When the sawtooth voltage is coupled to teminal B by capacitor 19, the AC zero or average DC value at terminal B is no longer $V_{ref}$, but $V_{ref} + \Delta V$, as shown in FIG. 4B. Output signals still occur when the sawtooth input voltage equals $V_{ref}$, which causes the bilevel output voltage at terminal C to shift levels when transistor 8 changes conduction states. Now, however, due to the higher DC value of the sawtooth voltage, the shifting of the bilevel voltage occurs at a later time $T_2''$ relative to $T_2'$ and at even later time $T_4''$ relative to $T_4''$. The offset voltage $\Delta V$ is so chosen as to adjust and equalize the intervals $T_2'' - T_4''$ and $T_4'' - T_6''$ of FIG. 4B, thereby making the output signals symmetrical at a $2f_H$ frequency rate, as shown in FIG. 4C.

Figure 5:
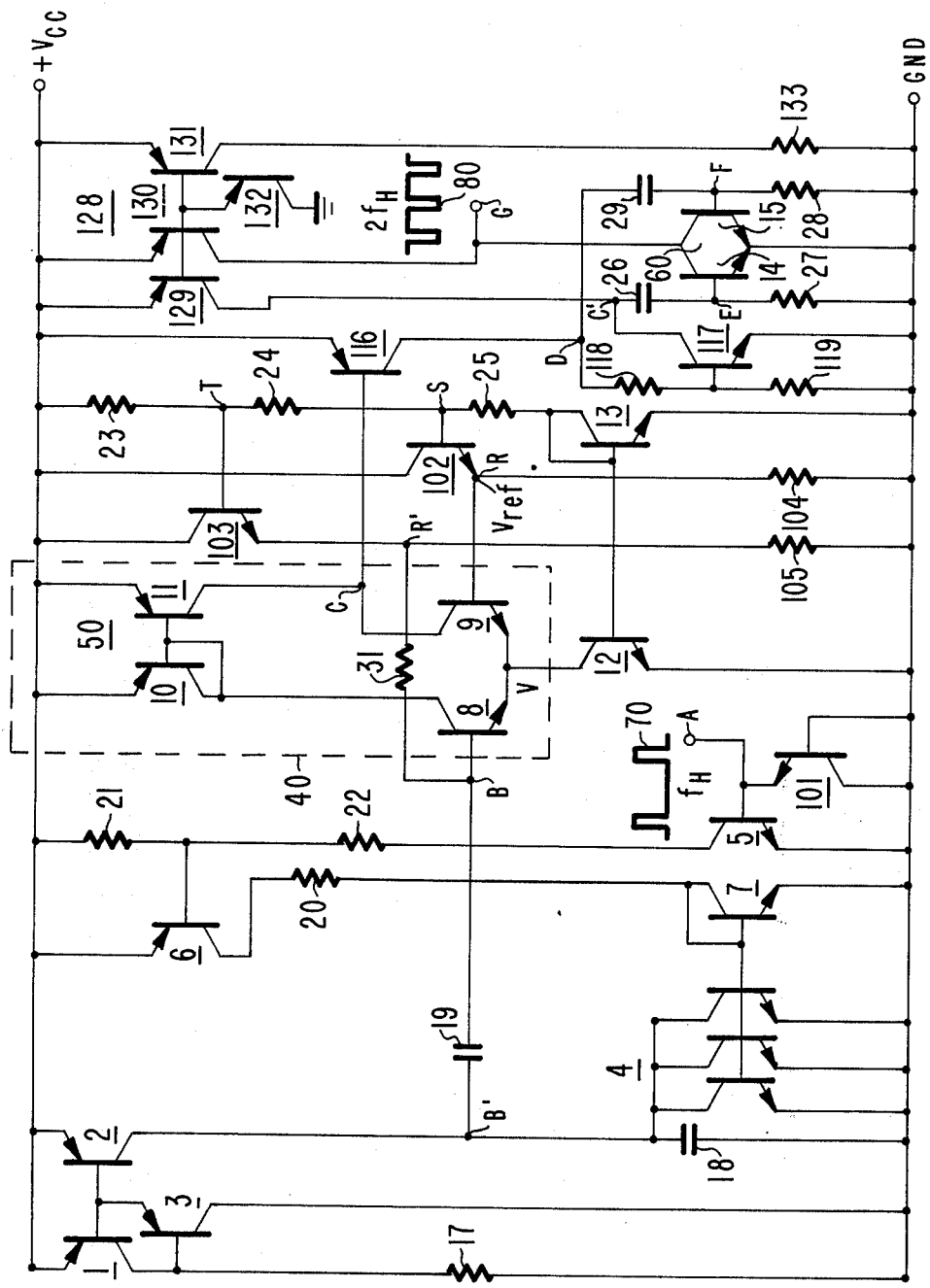
FIG. 5 is a circuit schematic of another embodiment of a frequency doubler according to the invention.

The circuit of FIG. 5 is another embodiment of the invention and is suitable for integration on an integrated circuit chip. It performs the same frequency doubling function as the circuit of FIG. 1. Circuit elements of FIG. 5 which correspond to similarly functioning elements of FIG. 1 have been identically identified.

Discharging transistor 4 is shown in FIG. 5 as three parallely coupled transistors for distributing the relatively high discharge current between each of them. A transistor having its base and collector connected together and functioning as a protective diode 101 has been coupled between input terminal A and ground. The diode 101 protects input transistor 5 against damage due to negative voltages.

The input terminals B and r of differential amplifier 40 for greater isolation are no longer directly coupled to resistors 24 and 25 for providing the reference voltages. Instead, they are coupled to emitter follower transistors 102 and 103 whose bases are coupled respectively to terminals S and T of resistors 25 and 24. Terminal R, as in circuit 1, is still maintained at $V_{ref}$, and terminal B is still maintained at $V_{ref} + \Delta V$. The offset voltage $\Delta V$, as in circuit 1, is required to equalize the duration of each of the bilevel voltage levels at terminal C. Biasing for transistors 102 and 103 are provided by resistors 104 and 105, respectively.

Current limiting resistor 28 of FIG. 1 has been replaced in FIG. 5 by a constant current source 128 comprising appropriately coupled transistors 129 – 132 and a resistor 133. Current is provided by source 128 at the collectors of transistors 129 and 130.

Inverter 16 in FIG. 1 is shown in FIG. 5 as an inverting transistor 116 which is coupled to terminal D through its collector. Inverting transistor 116 provides a second bilevel voltage at terminal D 180° out-of-phase with the bilevel voltage produced at terminal C. When the voltage at terminal C shifts to its upper level, transistor 116 is no longer forward biased, and its output at terminal D shifts to its lower level. An opposite result occurs when terminal C shifts to its lower level.

Terminal D is coupled to the base of a transistor 117 through a resistor 118. The base of transistor 117 is coupled to ground through a resistor 119. The emitter of transistor 117 is coupled to ground; the collector is coupled to one end of capacitor 26 at a terminal C' and is also coupled to the collector of transistor 129.

When the bilevel output voltage at terminal C shifts to its upper level, the bilevel voltage at terminal D shifts to its lower level. Transistor 117 is no longer forward biased, and terminal C' shifts to its upper level. A positive differentiated pulse appears at terminal E. The pulse is waveshaped by transistor 14 and appears as an output signal at terminal G.

When the bilevel output voltage at terminal C shifts to its lower level, the bilevel voltage at terminal D shifts to its upper level. A positive differentiated pulse appears at terminal F and is waveshaped by transistor 15 and appears as an output signal at terminal G.

The above-described circuits provide for symmetrical frequency doubled output signals over a wide input signal frequency range. The circuits use standard components only and do not use any frequency determining reactive elements or other elements, such as silicon controlled rectifiers and zener diodes, which are unsuited for integrated circuit manufacture.

Relatively few circuit elements are used for the limited space available. Only two relatively large valued capacitors are used external to an integrated circuit chip, charging capacitor 18 and coupling capacitor 19. All other elements may be integrated on the chip. The active switching circuit 50 comprising diode 10 and transistor 11 is superior to a resistive network by providing a low heat loss, a small voltage drop when conducting current, and a small geometry for integration.

The differential amplifier is biased from a single-ended $+V_{cc}$ supply. No bipolar power supplies are needed. Because the components on the chip are in close proximity to each other and have matching electrical characteristics, circuit performance does not degrade under supply voltage variations and temperature changes.

What is claimed is:

1. A frequency doubler comprising:
   a differential amplifier including first and second input terminals and an output terminal;
   first biasing means coupled to said differential amplifier for biasing said second input terminal at a first reference voltage level;
   sawtooth means coupled to said first input terminal for providing a sawtooth voltage of a first frequency at said first input terminal for generating a first bilevel voltage at said output terminal, said first bilevel voltage shifting levels when said sawtooth voltage equals said first reference voltage level;
   second biasing means coupled to said first input terminal for biasing said first input terminal at a second reference voltage level, said second reference voltage level selected to differ from said first reference voltage level by an offset voltage sufficient to equalize the duration of each of said first bilevel voltage levels; and
   output signal producing means coupled to said output terminal for producing output signals when said first bilevel voltage shifts levels, thereby producing said output signals at twice said first frequency.

2. A frequency doubler according to claim 1, wherein said second biasing means is coupled to said first biasing means for developing said offset voltage.

3. A frequency doubler according to claim 2, wherein said first biasing means is coupled between a source of first polarity voltage and ground.

4. A frequency doubler according to claim 2, wherein said offset voltage is developed across a resistor.

5. A frequency doubler according to claim 1, wherein said first input terminal is coupled to a first emitter follower transistor, the base of said first emitter follower transistor coupled to said second biasing means.

6. A frequency doubler according to claim 1, wherein said second input terminal is coupled to a second emitter follower transistor, the base of said second emitter follower transistor coupled to said first biasing means.

7. A frequency doubler according to claim 1, wherein said first biasing means includes constant current means for providing a constant current to said differential amplifier.

8. A frequency doubler according to claim 7, wherein said constant current means comprises a first transistor whose base is coupled to a first diode, said first diode polarized for forward biasing said first transistor.

9. A frequency doubler according to claim 7, wherein said first biasing means includes a plurality of series coupled resistors for providing said first reference voltage at said second input terminal.

10. A frequency doubler according to claim 1, wherein said sawtooth means includes a first capacitor for AC coupling said sawtooth voltage to said first input terminal.

11. A frequency doubler according to claim 10, wherein said sawtooth means includes:
    a second capacitor;

means coupled to said second capacitor for charging said second capacitor; and input switching means coupled to said second capacitor and responsive to input signals occurring at intervals that are repeating at said first frequency for discharging said second capacitor during a portion of each of said intervals and charging said capacitor during another portion of each of said intervals.

12. A frequency doubler according to claim 1, wherein said differential amplifier includes a pair of differentially coupled like conductivity transistors, said first differentially coupled transistor coupled to said first input terminal and said second differentially coupled transistor coupled to said output terminal.

13. A frequency doubler according to claim 12, wherein said differential amplifier includes output switching means comprising a switching transistor coupled to said output terminal, and a second diode coupled to said first differentially coupled transistor and to said switching transistor and polarized for forward biasing said switching transistor when said first differentially coupled transistor is conducting for providing said first bilevel voltage at said output terminal.

14. A frequency doubler according to claim 1, wherein said output signal producing means includes a differentiating network for producing differentiated pulses when said first bilevel voltage shifts levels and waveshaping means for shaping said differentiated pulses into said output signals.

15. A frequency doubler according to claim 14, wherein said output signal producing means includes inverting means for providing a second bilevel voltage, said second bilevel voltage shifting to its upper level when said first bilevel voltage shifts to its lower level and said second bilevel votage shifting to its lower level when said first bilevel voltage shifts to its upper level, and wherein said differentiating network is responsive to both of said bilevel voltages for producing said differentiated pulses when either of said bilevel voltages shifts levels.

* * * * *